(12) United States Patent
Chang et al.

(10) Patent No.: US 9,281,397 B2
(45) Date of Patent: Mar. 8, 2016

(54) SEMICONDUCTOR DEVICE INCLUDING AN ASYMMETRIC FEATURE

(71) Applicant: GLOBALFOUNDRIES Inc., Grand Cayman (KY)

(72) Inventors: Josephine Chang, Mahopac, NY (US); Isaac Lauer, Mahopac, NY (US); Chung-Hsun Lin, White Plains, NY (US); Jeffrey Sleight, Ridgefield, CT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/158,539

(22) Filed: Jan. 17, 2014

(65) Prior Publication Data

US 2014/0131708 A1    May 15, 2014

Related U.S. Application Data

(62) Division of application No. 13/194,980, filed on Jul. 31, 2011, now Pat. No. 8,877,593.

(51) Int. Cl.
*H01L 29/417* (2006.01)
*H01L 29/78* (2006.01)
*H01L 27/088* (2006.01)
*H01L 21/8234* (2006.01)
*H01L 21/8238* (2006.01)
*H01L 29/66* (2006.01)

(52) U.S. Cl.
CPC .... *H01L 29/7835* (2013.01); *H01L 21/823425* (2013.01); *H01L 21/823475* (2013.01); *H01L 21/823814* (2013.01); *H01L 21/823871* (2013.01); *H01L 27/088* (2013.01); *H01L 29/41775* (2013.01); *H01L 29/66659* (2013.01); *H01L 29/7845* (2013.01)

(58) Field of Classification Search
CPC ............ H01L 29/7835; H01L 29/7845; H01L 21/823425; H01L 21/823475
USPC .................. 257/327, 401, E29.268, E29.279
See application file for complete search history.

(56) References Cited

U.S. PATENT DOCUMENTS

| | | | |
|---|---|---|---|
| 5,795,830 A | 8/1998 | Cronin et al. | |
| 6,297,104 B1 | 10/2001 | Tyagi et al. | |
| 6,466,489 B1 | 10/2002 | Ieong et al. | |
| 6,649,976 B2 * | 11/2003 | Iwamatsu et al. | ............. 257/344 |
| 6,686,245 B1 | 2/2004 | Mathew et al. | |
| 7,626,219 B2 | 12/2009 | Forbes | |
| 7,687,342 B2 | 3/2010 | Haller et al. | |

(Continued)

OTHER PUBLICATIONS

Sematech, "Test Structures for Benchmarking the Electrostatic Discharge (ESD) Robustness of CMOS Technologies", Sematech Technology Transfer # 98013452A-TR, Feb. 27, 1998.

*Primary Examiner* — Jerome Jackson, Jr.
*Assistant Examiner* — Paul Budd
(74) *Attorney, Agent, or Firm* — Anthony Canale; Andrew M. Calderon; Roberts Mlotkowski Safran & Cole, P.C.

(57) ABSTRACT

A semiconductor device (e.g., field effect transistor (FET)) having an asymmetric feature, includes a first gate formed on a substrate, first and second diffusion regions formed in the substrate on a side of the first gate, and first and second contacts which contact the first and second diffusion regions, respectively, the first contact being asymmetric with respect to the second contact.

10 Claims, 8 Drawing Sheets

(56) References Cited

U.S. PATENT DOCUMENTS

| | | |
|---|---|---|
| 7,727,838 B2 | 6/2010 | Obradovic et al. |
| 7,803,709 B2 | 9/2010 | Yune |
| 8,110,470 B2 * | 2/2012 | Tan et al. ............ 438/303 |
| 2008/0121965 A1 | 5/2008 | Sato et al. |
| 2009/0096026 A1 * | 4/2009 | Bryant et al. ............ 257/348 |
| 2010/0187575 A1 | 7/2010 | Baumgartner et al. |
| 2012/0086054 A1 * | 4/2012 | Cheng et al. ............ 257/288 |

* cited by examiner

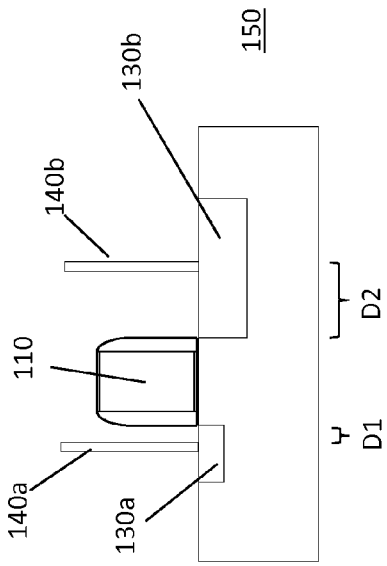
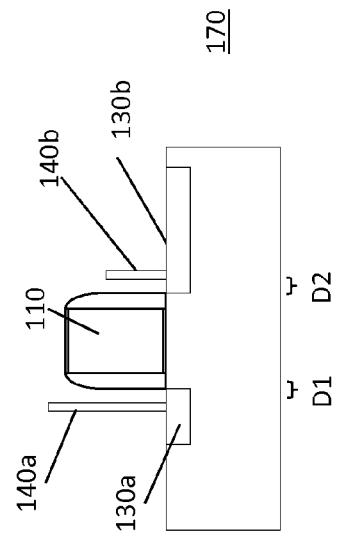
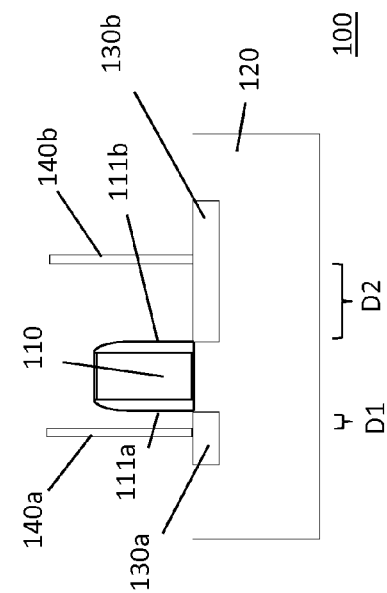
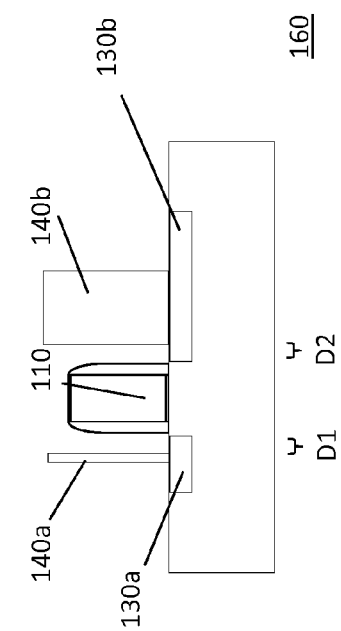

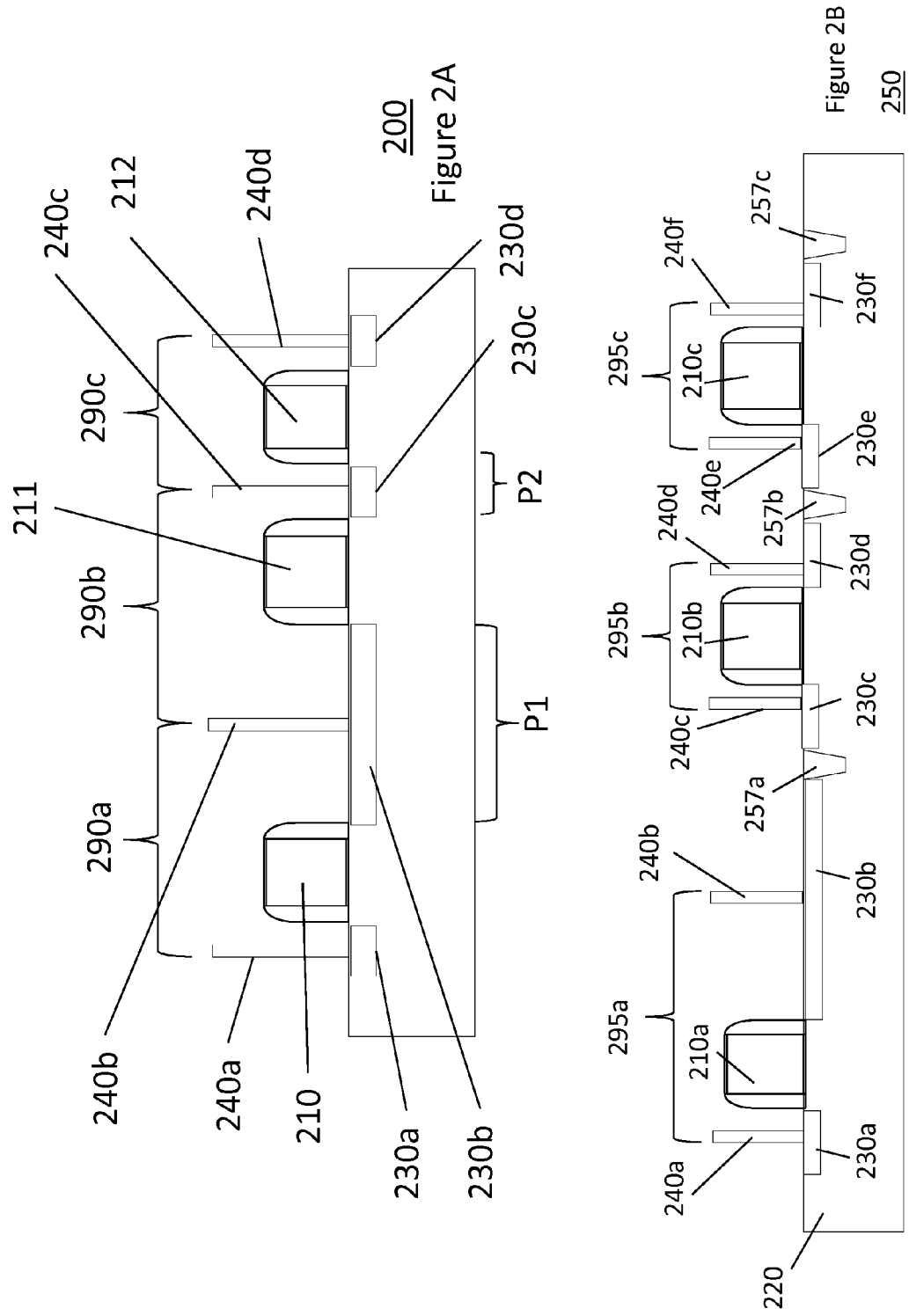

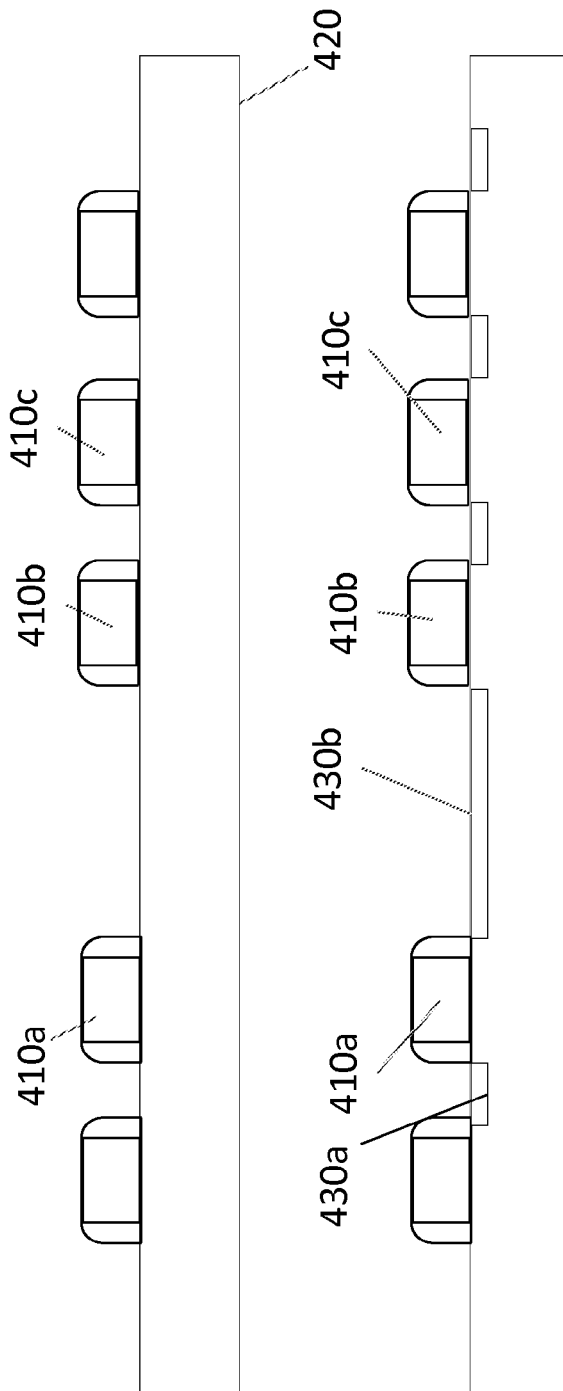
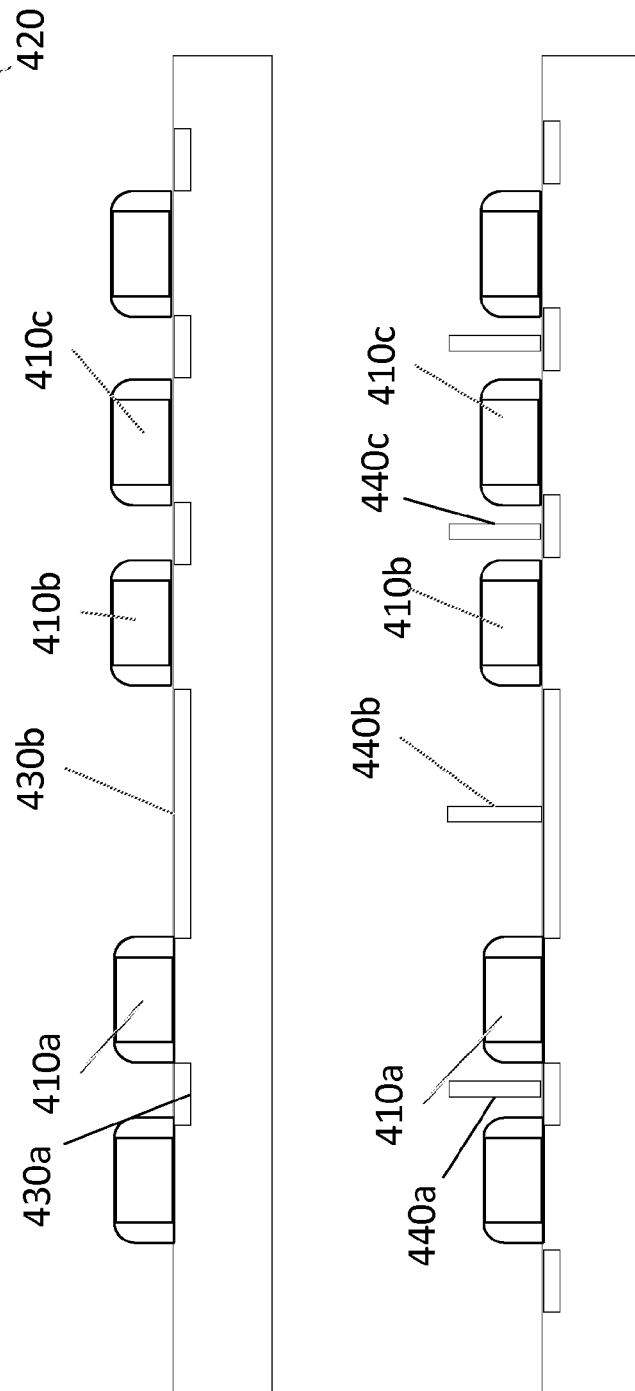
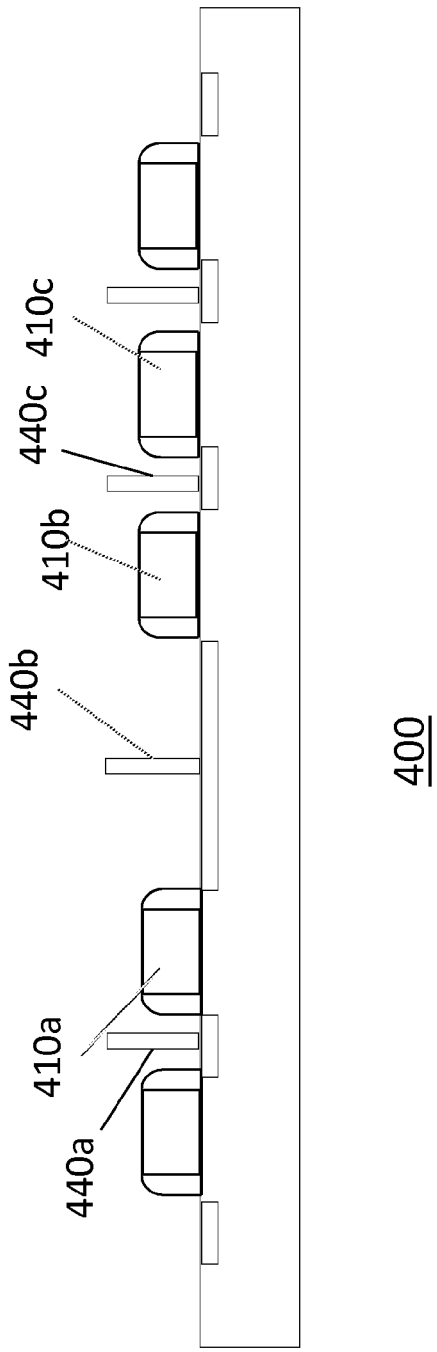
Figure 4A
Figure 4B
Figure 4C

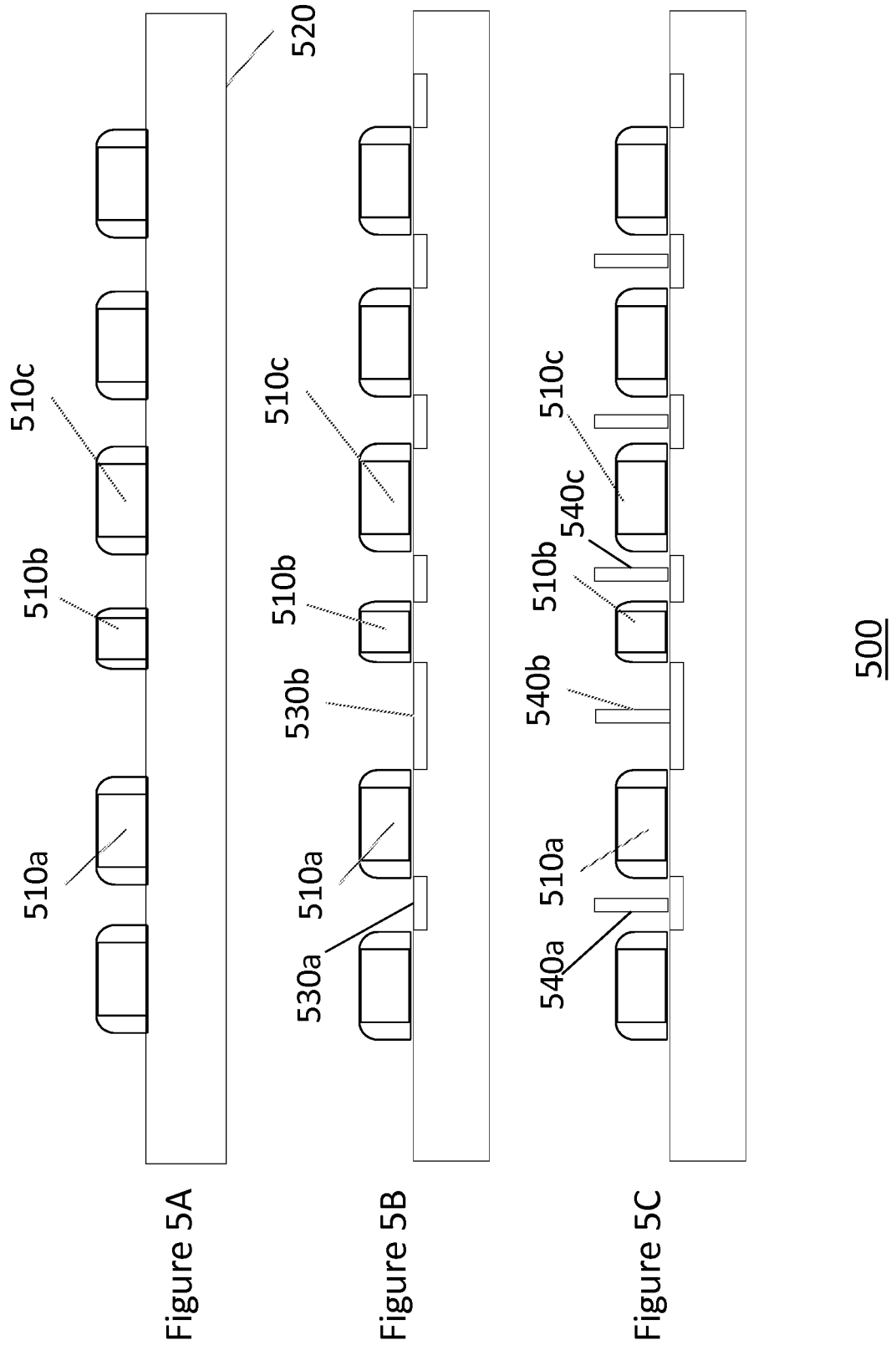

SEMICONDUCTOR DEVICE INCLUDING AN ASYMMETRIC FEATURE

CROSS-REFERENCE TO RELATED APPLICATIONS

This Application is a Divisional Application of U.S. patent application Ser. No.: 13/194,980, having filing date of Jul. 31, 2011.

BACKGROUND OF THE INVENTION

1. Field of the Invention

The present invention relates to a semiconductor device (and method of making the device) and more particularly, a semiconductor device which includes first and second contacts, the first contact being asymmetric with respect to the second contact.

2. Description of the Related Art

FIG. 7 illustrates a conventional semiconductor device 700 (e.g., field effect transistor (FET)). As illustrated in FIG. 7, the conventional device includes a gate 710, source and drain regions 730a, 730b, and contact layers 740a, 740b. As illustrated in FIG. 7 the source and drain regions 730a, 730b conventionally have the same width and depth (e.g., same volume) and are formed of the same material (e.g., the same doped semiconductor material).

In addition, as further illustrated in FIG. 7, the contact layers 740a, 740b conventionally have the same width and height (e.g., volume), and are formed the same distance away from the gate of the FET. In addition, the contact layers 740a, 740b are typically formed of the same material.

The contact layers 740a, 740b are layers of conductive material which are used to electrically connect features in conventional semiconductor devices. For example, in the conventional device 700, the first contact layer 740a may be used to contact the source region 730a, and the second contact layer 740b may be used to contact the drain region 730b.

The contact layers 740a, 740b may be formed as stressed contact layers which may apply a tensile or compressive stress on the underlying substrate. For example, in the example above, the first contact layer 740a may apply a stress to the source region 730a and the second contact layer 740b may be apply a stress to the drain region 740b.

The use of stressed contact layers to enhance device (e.g., field effect transistor (FET)) performance is becoming pervasive in advanced silicon complementary metal oxide semiconductor (CMOS) devices.

As pitch is further scaled, the amount of benefit incorporated (e.g., by the use of stressed contact layers) is a complex function of the contact material, contact size, and distance of the contact from the device.

SUMMARY OF THE INVENTION

In view of the foregoing and other problems, disadvantages, and drawbacks of the aforementioned conventional systems and methods, an exemplary aspect of the present invention is directed to an asymmetric contact device and a method of making the device.

An exemplary aspect of the present invention is directed a semiconductor device (e.g., field effect transistor (FET)) having an asymmetric feature. The semiconductor device includes a first gate formed on a substrate, first and second diffusion regions formed in the substrate on a side of the first gate, and first and second contacts which contact the first and second diffusion regions, respectively, the first contact being asymmetric with respect to the second contact.

Another exemplary aspect of the present invention is directed to a semiconductor device including an asymmetric feature. The device includes a first FET including a first gate formed on a substrate; first and second diffusion regions formed in the substrate on a side of the first gate; and first and second contacts which contact the first and second diffusion regions, respectively, the first contact being asymmetric with respect to the second contact. The device also includes a second FET formed on the substrate adjacent to the first FET and including a second gate formed on the substrate, third and fourth diffusion regions formed in the substrate on a side of the second gate, and third and fourth contacts which contact the third and fourth diffusion regions, respectively, and a third FET formed on the substrate adjacent to the second FET, the third FET including a third gate formed on the substrate, fifth and sixth diffusion regions formed in the substrate on a side of the third gate, and fifth and sixth contacts which contact the fifth and sixth diffusion regions, respectively. Further, a pitch between the first and second gates includes a first pitch and a pitch between the second and third gates includes a second pitch which is different from the first pitch, and the asymmetry of the first and second contacts includes one of the first contact is located a first distance from the first gate, and the second contact is located a second distance from the first gate, the second distance being different than the first distance, the first contact includes a first volume, and the second contact includes a second volume, the second volume being different than the first volume, the first contact includes a first material, and the second contact includes a second material, the second material being different than the first material, and the first contact includes one of a stressed and unstressed contact, and the second contact includes the other one of the stressed and unstressed contact.

Another exemplary aspect of the present invention is directed to a method of making a semiconductor device. The method includes forming a first gate a substrate, forming first and second diffusion regions in the substrate on a side of the first gate, and forming first and second contacts which contact the first and second diffusion regions, respectively, the first contact being asymmetric with respect to the second contact.

Another exemplary aspect of the present invention is directed to a method of making a semiconductor device, the method includes forming first, second and third field effect transistors (FETs) on a substrate, the first, second and third FETs including first, second and third gates, respectively, such that a pitch between the first and second gates includes a first pitch and a pitch between the second and third gates includes a second pitch which is different than the first pitch, by one of a first process of using a mask to lithographically define the second gate adjacent to the first gate on the substrate, and the third gate adjacent to the second gate on the substrate, such that the second pitch is different than the first pitch, a second process of, using a mask to lithographically define a plurality of gates including the second gate adjacent to the first gate on the substrate, the third gate adjacent to the second gate on the substrate, and an intermediate gate between the first and second gates on the substrate, a pitch between the plurality of gates including the same pitch, and removing the intermediate gate such that the second pitch is different than the first pitch, and a third process of using a mask to lithographically define a second gate adjacent to the first gate on the substrate, such that the second gate has a channel length which is less than a channel length of the first gate.

With its unique and novel features, the present invention may provide a manner of achieving different drive strengths in a semiconductor device (e.g., a field effect transistor device) without (or in addition to) the use of channel doping.

BRIEF DESCRIPTION OF THE DRAWINGS

The foregoing and other objects, aspects and advantages will be better understood from the following detailed description of the embodiments of the invention with reference to the drawings, in which:

FIG. 1A illustrates a semiconductor device 100, according to the exemplary aspects of the present invention;

FIG. 1B illustrates a semiconductor device 150, according to the exemplary aspects of the present invention;

FIG. 1C illustrates a semiconductor device 160, according to the exemplary aspects of the present invention;

FIG. 1D illustrates a semiconductor device 170, according to the exemplary aspects of the present invention;

FIG. 2A illustrates a semiconductor device 200, according to the exemplary aspects of the present invention;

FIG. 2B illustrates a semiconductor device 250, according to the exemplary aspects of the present invention;

FIG. 4A illustrates a method 400 of making a semiconductor device (e.g., forming gates 410a, 410b and 410c), according to the exemplary aspects of the present invention;

FIG. 4B illustrates a method 400 of making a semiconductor device (e.g., forming diffusion regions 430a, 430b), according to the exemplary aspects of the present invention;

FIG. 4C illustrates a method 400 of making a semiconductor device (e.g., forming contacts 440a, 440b and 440c), according to the exemplary aspects of the present invention;

FIG. 5A illustrates a method 500 of making a semiconductor device (e.g., forming gates 510a, 510b and 510c), according to the exemplary aspects of the present invention; and FIG. 5B illustrates a method 500 of making a semiconductor device (e.g., forming diffusion regions 530a, 530b), according to the exemplary aspects of the present invention; and FIG. 5C illustrates a method 500 of making a semiconductor device (e.g., forming contacts 540a, 540b and 540c), according to the exemplary aspects of the present invention.

DETAILED DESCRIPTION OF EXEMPLARY

Embodiments of the Invention

Figure 1E:
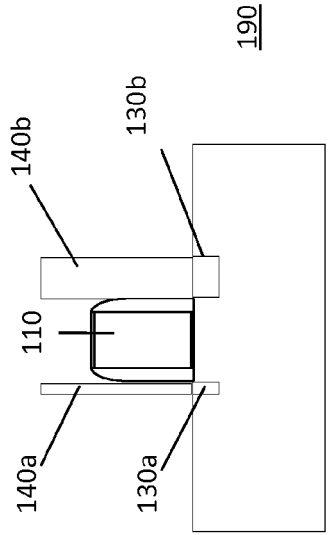
FIG. 1E illustrates a semiconductor device 180, according to the exemplary aspects of the present invention.
Figure 1F:
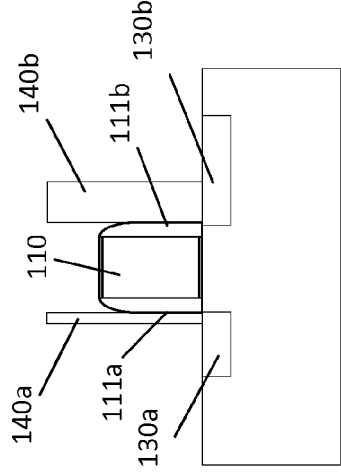
FIG. 1F illustrates a semiconductor device 190, according to the exemplary aspects of the present invention.

Referring now to the drawings, FIGS. 1A-6D illustrate some of the exemplary aspects of the present invention.

An exemplary aspect of the present invention is directed to a semiconductor device (e.g., a complementary metal-oxide-semiconductor (CMOS) device, a field-effect transistor (FET) device, etc.) having an asymmetric feature. The semiconductor device includes a first gate formed on a substrate, first and second diffusion regions formed in the substrate on a side of the first gate, and first and second contacts which contact the first and second diffusion regions, respectively, the first contact being asymmetric with respect to the second contact. The second diffusion region may have a width which is different than a width of the first diffusion region (e.g., equal to or greater than two times the width of the first diffusion region).

For example, the asymmetry of the first and second contacts may be in that the first contact is located a first distance from the first gate, and the second contact is located a second distance from the first gate, the second distance being different than the first distance, or in that the first contact includes a first volume, and the second contact includes a second volume, the second volume being different than the first volume, or in that the first contact includes a first material, and the second contact includes a second material, the second material being different than the first material, or in that the first contact includes one of a stressed and unstressed contact, and the second contact includes the other one of the stressed and unstressed contact.

Further, if at least one of first and second contacts is a stressed contact, the device (e.g., a FET) may be used, for example, to evaluate the impact of the stressed contact upon the device performance. Additionally, the asymmetric contacts may serve as another manner of achieving different drive strengths in the devices without (or in addition to) the use of channel doping. That is, a device having asymmetric contacts may have a drive strength which is different than a device having symmetric contacts (e.g., contacts having the same volume, same distance from the gate, same material, etc.).

Another exemplary aspect of the present invention is directed to a method of making a semiconductor device having an asymmetric feature. This may be accomplished, for example, by providing a "space" on one side of a gate which is greater than the "space" on the other side of the gate. Providing for such a greater space may be accomplished either by eliminating a gate (e.g., either 1) formed and removed, or 2) never formed), such that a "between gate" pitch may be greater at the location of the eliminated gate, or by forming the adjacent gate to have a smaller gate length than other gates in the row.

That is, a pitch on one side of a gate may be made greater than a pitch on the other side of the gate, by performing at least one of the following:

1) Never lithographically defining a second gate which would normally be adjacent to the gate (e.g., the pitch between gates on the drain side may be about two times (or more than two times) the pitch between gates on the source side), or removing the second gate in a process (e.g., a cut mask process) prior to halo implant; and 2) Forming the second gate to have a gate length which is less than (e.g., less than or equal to ½) a gate length of the first gat (e.g., a lithographic mask may be used to define a gate length of the second gate to be less than a gate length of the first gate).

FIG. 1A illustrates a semiconductor device 100 according to an exemplary aspect of the present invention. The device 100 may include a field effect transistor (FET) (e.g., a metal oxide semiconductor field effect transistor (MOSFET)) or any other device which includes a gate and plural contacts associated with the gate.

The device 100 includes a first gate 110 (e.g., a polysilicon gate or metal gate, or some combination of polysilicon and metal) formed on a semiconductor substrate 120. The semiconductor substrate 120 may include a silicon substrate (as illustrated in FIG. 1A) or a silicon-on-insulator (SOI) substrate.

The device 100 also includes first and second diffusion regions 130a, 130b (e.g., source and drain regions which may include n-doped regions or p-doped regions) formed in the substrate 120 on a side of the first gate 110, a first contact 140a (e.g., metal, polysilicon or other electrically conductive material) which contacts the first diffusion region 130a, and a second contact 140b which contacts the second diffusion region 130b.

The first contact 140a is asymmetric with respect to the second contact 140b. In the exemplary aspect of FIG. 1A, the first contact 140a is located a first distance D1 from the first gate 110, and the second contact 140b is located a second distance D2 from the first gate 110, the second distance D2 being greater than the first distance D1 (i.e., D2>D1). In an exemplary aspect, the second distance D2 may be equal to or greater than two times the first distance D1. As a practical matter, the first distance D1 may be in a range of 0 µm to 50 µm, and the second distance D2 may be in a range from 0 µm to 150 µm.

Further, for purposes of the present invention, the "distance" between the first gate 110 and the first and second contacts 140a, 140b should be measured in a direction parallel to the surface of the substrate 120, and should be measured at the greatest width of the first gate 110. That is, in the device 100, the distance should be measured from the outermost surfaces of the sidewall spacers 111a, 111b which are formed on a sidewall of the first gate 110.

In addition, as illustrated in FIG. 1A, the second diffusion region 130b (e.g., source or drain region) may have width which is greater than the width of first diffusion region 130a (e.g., equal to or greater than two times the width of the first diffusion region). This may allow the device 100 to accommodate the greater distance between the second contact 140b and the first gate 110.

Further, the second diffusion region 130b may have a depth which is different than a depth of the first diffusion region 130a. For example, as illustrated in FIG. 1B, the device 150 is similar to the device 100, except that in the device 150, the depth of the second diffusion region 130b is greater than a depth of the first diffusion region 130a (e.g., equal to or greater than two times the depth of the first diffusion region 130a).

The second diffusion region 130b may also be formed of a different material that the first diffusion region 130a. That is, the depth of the first and second diffusion regions 130a, 130b may be the same, but the dopant (e.g., arsenic ions, boron ions, etc.) and/or the dopant concentration in the first diffusion region 130a may be different than the dopant and/or dopant concentration in the second diffusion region 130b.

As noted above, the asymmetry between the first and second contacts 140a, 140b may also be provided in that that the first contact 140a includes a first material, and the second contact 140b includes a second material, the second material being different than the first material. For example, the first material (e.g., tungsten) may have an electrical property (e.g., electrical conductivity) which is different from an electrical property of the second material (e.g., copper, aluminum, polysilicon, etc.).

As also noted above, the asymmetry between the first and second contacts 140a, 140b may also be provided in that in that the first contact 140a includes one of a stressed and unstressed contact, and the second contact 140b includes the other one of the stressed and unstressed contact.

However, the asymmetry between the first and second contacts 140a, 140b may also be provided in that the first contact includes a first volume, and the second contact includes a second volume, the second volume being different than the first volume. For example, FIG. 1C illustrates a device 160 in which D1 is substantially equal to D2, but the volume of the second contact 140b is greater than the volume of the first contact 140a. In particular, the second contact 140b has a width which is greater than a width of the first contact 140a (e.g., equal to or greater than two times a width of the first contact 140a).

Similarly, FIG. 1D illustrates a device 170 in which D1 is substantially equal to D2, but the volume of the second contact 140b is less than the volume of the first contact 140a. In particular, the second contact 140b has a height which is less than a height of the first contact 140a (e.g., equal to or less than one-half of a height of the first contact 140a).

It should be noted that the contacts 140a, 140b may be formed to contact the spacers 111a, 111b, respectively. FIG. 1E illustrates a device 180 in which the second contact 140b has a width which is greater than a width of the first contact 140a. In the device 180, the first contact 140a contacts the first spacer 111a, and the second contact 140b contacts the second spacer 111b. That is, in the device 180, D1=D2=0.

Further, the contacts 140a, 140b may have a width which corresponds to a width of the diffusion regions 130a, 130b, respectively. Figure IF illustrates a device 190 in which the first contact 140a has a width which is substantially equal to width of the first diffusion region 130a, and the second contact 140b has a width which is substantially equal to the width of the second diffusion region 130b.

It should also be noted that any one or more of the asymmetric features may be provided together in a device. For example, FIG. 1G illustrates a device 195 in which D2 is greater than D1, and width of the second contact 140b is greater than a width of the first contact 140a, and a depth of the second diffusion region 130b is greater than a depth of the first diffusion region 130a.

Figure 1G:
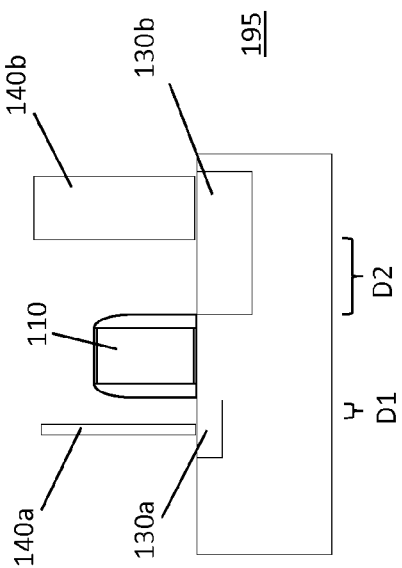
FIG. 1G illustrates a semiconductor device 195, according to the exemplary aspects of the present invention.

Further, as illustrated in FIG. 1G, the second contact 140b may be located toward an outer edge of the second diffusion region 130b (e.g., an edge of the second diffusion region 130b which is located the furthest away from the first gate 110) in order to allow for the greater distance between the first gate 110 and the second contact 140b.

FIG. 2A illustrates another device 200 according to another exemplary aspect of the claimed invention.

As illustrated in FIG. 2A, the device 200 includes a first FET 290a including first and second diffusion regions 230a, 230b, a first gate 210a and first and second contacts 240a, 240b. As described above with respect to FIGS. 1A-1G, the first contact 240a is asymmetric with respect to the second contact 240b. For example, in the exemplary aspect of FIG. 2A, the distance between the first gate 210 and the second contact 240b is greater than the distance between the first gate 210 and the first contact 240a. However, any of the above described asymmetric features of the FIGS. 1A-1G may be used instead of or in addition to the asymmetric distances illustrated in FIG. 2A.

The device 200 also includes a second FET 290b which includes a second gate 210b and is formed on the substrate adjacent to the first FET 210a. The FET 290b also includes a third diffusion region 230c formed in the substrate on a side of the second gate 210b, and a contact 240c which contacts the third diffusion region 230c. However, the second FET 290b may share the diffusion region 230b and contact 240b with the first FET 290a.

The device 200 may also include a third FET 290c which includes a gate 210c, a diffusion region 230d and a contact 240d which contacts the diffusion region 230d. The third FET 290c may share the diffusion region 230c and contact 240c with the second FET 290b.

With this configuration, the first and second FET's 290a, 290b are asymmetric contact FETs. That is, a distance between the second contact 240b and the first gate 210a is different than a distance between the first contact 240a and the first gate 210a making the first FET 290a asymmetric, and a distance between the second contact 240b and the second gate 210b is different than a distance between the third contact 240c and the second gate 210b making the second FET 290b asymmetric.

However, the contacts 240c, 240d which are utilized by the third FET 290c are located the same distance (e.g., substantially the same distance) from the third gate 210c and thus, the third FET 290c is not an asymmetric contact FET, but is a symmetric contact FET.

As illustrated in FIG. 2A, the pitch P1 between the first and second gates 210a, 210b is greater (e.g., at least two times greater) than the pitch P2 between the second and third gates. As noted above, this may be obtained by a process in which a gate which normally would be formed adjacent to the first and second gates 210a, 210b is never defined lithographically, or is removed in a process (e.g., a cut mask process).

Another process (not illustrated in FIG. 2A) for obtaining a pitch P1 to be greater than the pitch P2 is to form (using a mask) the first gate 210a or the second gate 210b (or both first and second gates 210a, 210b) to have a gate length which is less than a gate length of other gates in the device (e.g., third gate 210c).

FIG. 2B illustrates another device 250 according to another exemplary aspect of the claimed invention. As illustrated in FIG. 2B, the device 250 includes a first FET 295a formed on a substrate 220. The first FET 295a includes a first gate 210a, first and second diffusion regions 230a, 230b and first and second contacts 240a, 240b. The device 250 also includes a second FET 295b formed on the substrate 220 adjacent to the first FET 295a and including a second gate 210b formed on the substrate 220, third and fourth diffusion regions 230c, 230c formed in the substrate 220 on a side of the second gate 210b, and third and fourth contacts 240c, 240d which contact the third and fourth diffusion regions 230a, 230b, respectively.

The device 250 also includes a third FET 295c formed on the substrate 220 adjacent to the second FET 295b, the third FET 295c including a third gate 210c formed on the substrate 220, fifth and sixth diffusion regions 230e, 230f formed in the substrate 220 on a side of the third gate 210c, and fifth and sixth contacts 240e, 240f which contact the fifth and sixth diffusion regions 230e, 230f, respectively. Further, as illustrated in FIG. 2B, the first and second FETs 295a, 295b may be electrically isolated from each other by field oxide 257a, the second and third FETs 295b, 295c may be electrically isolated from each other by field oxide 257b, and the third FET 295c may be electrically isolated from other devices by field oxide 257c.

Further, a pitch between the first and second gates 210a, 210b may include a first pitch and a pitch between the second and third gates 210b, 210c may include a second pitch which is different from (e.g., less than) the first pitch.

As illustrated in FIG. 2B, the first FET 295a is an asymmetric contact FET, and the second and third FETs 295b, 295c are symmetric contact FETs. Further, the device 250 may include a complementary metal oxide semiconductor (CMOS) device in which the first FET 295a is a p-type FET, and the second FET 295b is an n-type FET, or the first FET 295a is an n-type FET, and the second FET 295b is an p-type FET. Further, the substrate 220 may include a silicon substrate (as illustrated in FIG. 2B) or an SOI substrate (in which case the first, second and third FETs 295a, 295b, 295c would be formed on the silicon substrate 220 above a buried oxide layer).

Further, in the device 250, the first FET 295a and second FET 295b may include undoped channel regions formed under the gates, but may have different drive strengths. That is, the asymmetric features (e.g., asymmetric contacts) in the second FET 295b may cause the second FET 295b to have a drive strength which is less than (or greater than) the drive strength of the first FET 295a without (or in addition to) the use of channel doping.

Further, as in the exemplary aspect of FIG. 2A, in the first FET 295a, asymmetry is provided in that the distance between the gate 210a and the second contact 240b is greater than the distance between the gate 210a and the first contact 240a. However, any of the above described asymmetric features of the FIGS. 1A-1G may be used instead of or in addition to the asymmetric distances illustrated in FIG. 2B.

Further, although the gate lengths of the gates 210a, 210b and 210c are the same in FIG. 2B, it is possible that the gate length of the gate 210b may be made to be less than the gate lengths of the gates 210a, 210c (e.g., equal to or less than about ½ of the gate lengths of the gates 210a, 210c). In addition, as illustrated in FIG. 2B, the second diffusion region 230b includes a width which is greater than a width of the first diffusion region 230a.

Another exemplary aspect of the present invention is directed to a logic device (e.g., a device which provides a specific function, including, for example, device-to-device interfacing, data communication, signal processing, data display, timing and control operations) which includes a semiconductor device having an asymmetric feature (e.g., an asymmetric contact FET) according to the exemplary aspect of the present invention.

Another exemplary aspect of the present invention is directed to a test structure for evaluating an impact of a stressed contact (e.g., a contact which applies a mechanical stress to the substrate on which the contact is formed) upon performance of a device, the test structure including a semiconductor device (e.g., asymmetric contact device) according to the exemplary aspect of the present invention.

Figure 3:
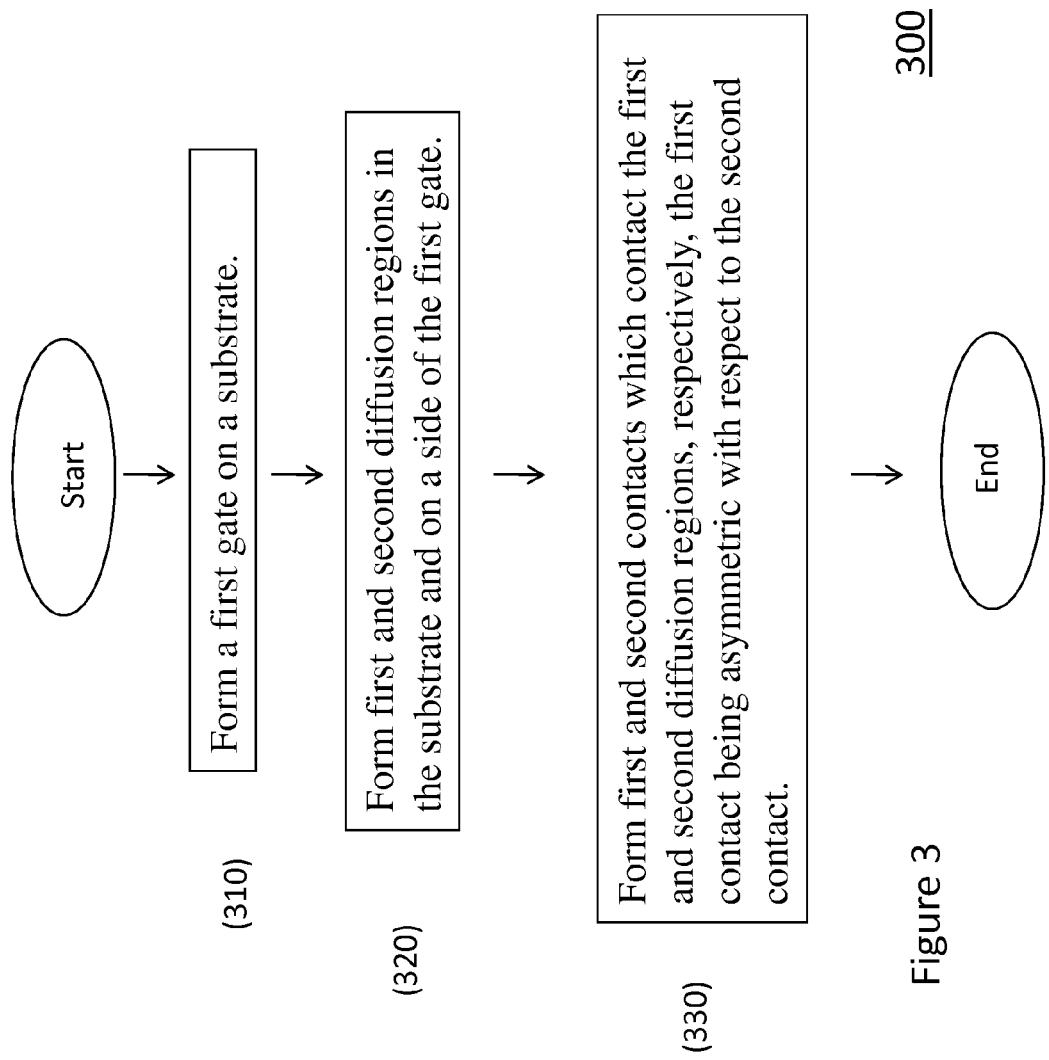
FIG. 3 illustrates a method 300 of making a semiconductor device, according to the exemplary aspects of the present invention.

FIG. 3 illustrates a method 300 of forming a semiconductor device having an asymmetric feature (e.g., asymmetric contacts), according to another exemplary aspect of the present invention. As illustrated in FIG. 3, the method 300 includes forming (310) a first gate on a substrate, forming (320) first and second diffusion regions in the substrate on a side of the first gate, and forming (330) first and second contacts which contact the first and second diffusion regions, respectively, the first contact being asymmetric with respect to the second contact.

As noted above, the asymmetry of the first and second contacts may be in that the first contact is located a first distance from the first gate, and the second contact is located a second distance from the first gate, the second distance being different than the first distance, or in that the first contact includes a first volume, and the second contact includes a second volume, the second volume being different than the first volume, or in that the first contact includes a first material, and the second contact includes a second material, the second material being different than the first material, or in that the first contact includes one of a stressed and unstressed contact, and the second contact includes the other one of the stressed and unstressed contact.

FIGS. 4A-4C, 5A-5C and 6A-6D illustrate methods 400, 500 and 600 of forming a semiconductor device having an asymmetric feature (e.g., a field effect transistor (FET) having asymmetric contacts) according to other exemplary aspects of the present invention. More particularly, FIGS. 4A-4C illustrate a method 400 in which a pitch on one side of a gate may be made greater than a pitch on the other side of the gate by never lithographically defining a second gate (e.g., an adjacent gate) which would normally be adjacent to the gate (e.g., the pitch between gates on the drain side may be about two times (or more) the pitch between gates on the source side).

FIGS. 5A-5C illustrate a method 500 in which a pitch on one side of a gate may be made greater than a pitch on the other side of the gate by forming the second gate (e.g., an adjacent gate) to have a gate length which is less than (e.g., much less than) a gate length of the first gate (e.g., a lithographic mask may be used to define the gate length of the second gate to be less than a gate length of the first gate).

FIGS. 6A-6D illustrate a method 600 in which a pitch on one side of a gate may be made greater than a pitch on the other side of the gate by removing a second gate (e.g., an adjacent gate) in a process (e.g., a cut mask process) prior to halo implant.

As illustrated in FIG. 4A, the method 400 may include forming a plurality of gates including gates 410a, 410b and 410c on a substrate 420 using a lithographic mask which does not define a gate between the gates 410a, 410b, so that the pitch between gates 410a, 410b is greater than (e.g., at least twice) a pitch between other gates (e.g., the pitch between gates 410b and 410c) in the plurality of gates.

The method 400 also includes forming the diffusion regions 430a, 430b by ion implantation (e.g., using a halo implant) (as illustrated in FIG. 4B), and forming contacts 440a, 440b on the diffusion regions 430a, 430b, respectively, so that the distance between the gate 410a and the contact 440b is greater than the distance between the gate 410a and the contact 440a (FIG. 4C).

The asymmetry in the method 400 is provided by the asymmetry of the contacts with respect to the gates 410a and 410b. That is, contact 440a is located a first distance from the gate 410a and contact 440b is located a second distance from the gate 410a, the second distance being greater than the first distance. In addition, contact 440c is located a first distance from the gate 410b, and contact 440b is located a second distance from the gate 410b, the second distance being greater than the first distance.

However, in addition to (or alternatively to) the asymmetry provided by distances between the contacts, asymmetry may be provided in that the first contact includes a first volume, and the second contact includes a second volume, the second volume being different than the first volume, or in that the first contact includes a first material, and the second contact includes a second material, the second material being different than the first material, or in that the first contact includes one of a stressed and unstressed contact, and the second contact includes the other one of the stressed and unstressed contact.

As illustrated in FIG. 5A, the method 500 may include forming a plurality of gates including gates 510a, 510b and 510c on a substrate 520 using a lithographic mask which defines the gate 510b to have a length which is less than a length of other gates (e.g., gates 510a, 510c) in the plurality of gates, so that the pitch between gates 410a, 410b is greater than (e.g., at least twice) a pitch between other gates (e.g., the pitch between gates 410b and 410c) in the plurality of gates.

The method 500 also includes forming the diffusion regions 530a, 530b by ion implantation (e.g., using a halo implant) (as illustrated in FIG. 5B), and forming contacts 540a, 540b on the diffusion regions 530a, 530b, respectively, so that the distance between the gate 510a and the contact 540b is greater than the distance between the gate 510a and the contact 540a (FIG. 5C).

As with the method 400, in the method 500, asymmetry is provided by the asymmetry of the contacts with respect to the gates 510a and 510b. That is, contact 540a is located a first distance from the gate 510a and contact 540b is located a second distance from the gate 510a, the second distance being greater than the first distance. In addition, contact 540c is located a first distance from the gate 510b, and contact 540b is located a second distance from the gate 510b, the second distance being greater than the first distance.

However, in addition to (or alternatively to) the asymmetry provided by distances between the contacts, asymmetry may be provided in that the first contact includes a first volume, and the second contact includes a second volume, the second volume being different than the first volume, or in that the first contact includes a first material, and the second contact includes a second material, the second material being different than the first material, or in that the first contact includes one of a stressed and unstressed contact, and the second contact includes the other one of the stressed and unstressed contact.

Figure 6A:
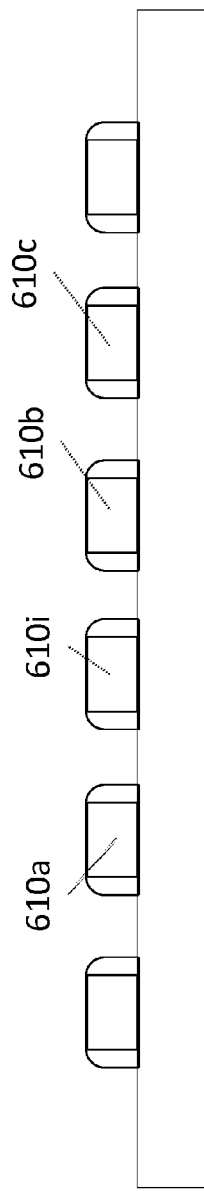
FIG. 6A illustrates a method 600 of making a semiconductor device (e.g., forming gates 610a, 610b, 610i and 610c), according to the exemplary aspects of the present invention.
Figure 6B:
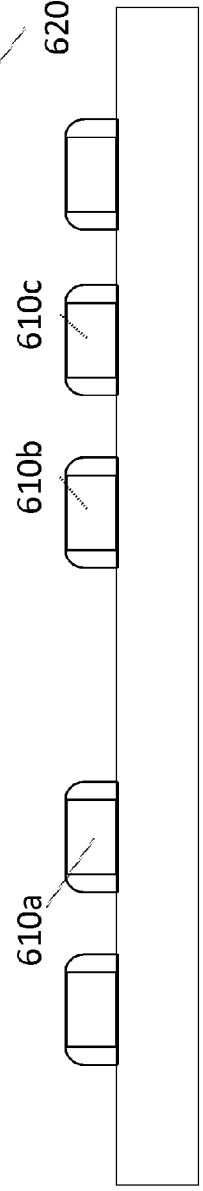
FIG. 6B illustrates a method 600 of making a semiconductor device (e.g., removing gate 610i), according to the exemplary aspects of the present invention.

As illustrated in FIG. 6A, the method 600 may include using a mask to lithographically define a plurality of gates including gates 610a, 610b and 610c and an intermediate gate 610i on a substrate 620 (e.g., a pitch between the plurality of gates being substantially the same pitch). The method 600 also includes removing the intermediate gate 610i (e.g., using a cut mask process) (FIG. 6B), so that the pitch between gates 610a, 610b is greater than (e.g., at least twice) a pitch between other gates (e.g., the pitch between gates 610b and 610c) in the plurality of gates.

Figure 6C:
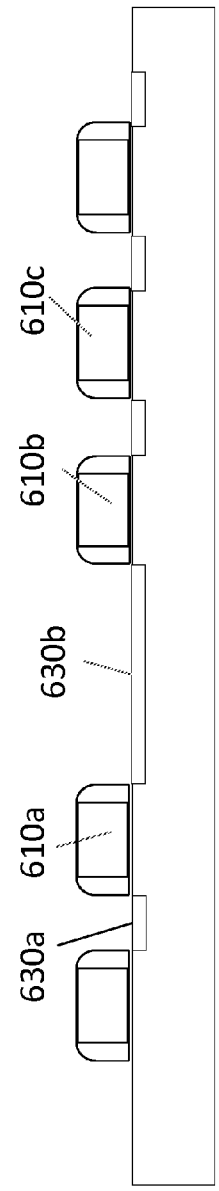
FIG. 6C illustrates a method 600 of making a semiconductor device (e.g., forming diffusion regions 630a, 630b), according to the exemplary aspects of the present invention.
Figure 6D:
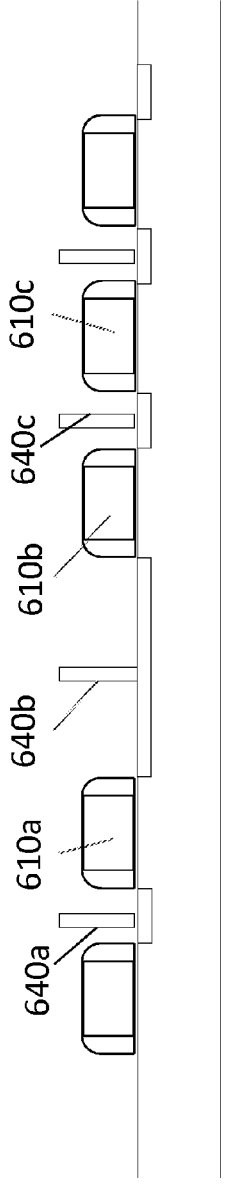
FIG. 6D illustrates a method 600 of making a semiconductor device (e.g., forming contacts 640a, 640b and 640c), according to the exemplary aspects of the present invention.
Figure 7:
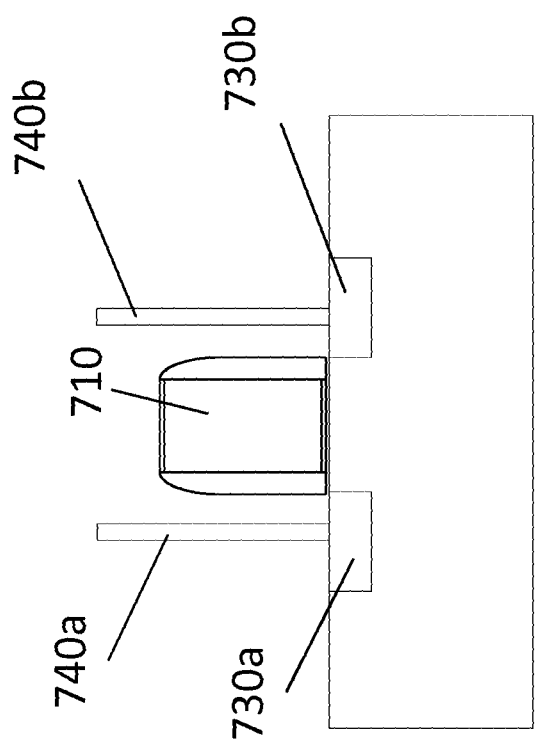
FIG. 7 illustrates a conventional semiconductor device 700.

The method 600 also includes forming the diffusion regions 630a, 630b by ion implantation (e.g., using a halo implant) (as illustrated in FIG. 6C), and forming contacts 640a, 640b on the diffusion regions 630a, 630b, respectively, so that the distance between the gate 610a and the contact 640b is greater than the distance between the gate 610a and the contact 640a (FIG. 6D).

As with the method 400 and method 500, in the method 600, asymmetry is provided by the asymmetry of the contacts with respect to the gates 610a and 610b. That is, contact 640a is located a first distance from the gate 610a and contact 640b is located a second distance from the gate 610a, the second distance being greater than the first distance. In addition, contact 640c is located a first distance from the gate 610b, and contact 640b is located a second distance from the gate 610b, the second distance being greater than the first distance.

However, in addition to (or alternatively to) the asymmetry provided by distances between the contacts, asymmetry may be provided in that the first contact includes a first volume, and the second contact includes a second volume, the second volume being different than the first volume, or in that the first contact includes a first material, and the second contact includes a second material, the second material being different than the first material, or in that the first contact includes one of a stressed and unstressed contact, and the second contact includes the other one of the stressed and unstressed contact.

With its unique and novel features, the present invention may provide a manner of achieving different drive strengths in a semiconductor device (e.g., a field effect transistor device) without (or in addition to) the use of channel doping.

While the invention has been described in terms of one or more embodiments, those skilled in the art will recognize that the invention can be practiced with modification within the spirit and scope of the appended claims. Specifically, one of ordinary skill in the art will understand that the drawings herein are meant to be illustrative, and the design of the inventive method and system is not limited to that disclosed herein but may be modified within the spirit and scope of the present invention.

Further, Applicant's intent is to encompass the equivalents of all claim elements, and no amendment to any claim the present application should be construed as a disclaimer of any interest in or right to an equivalent of any element or feature of the amended claim.

What is claimed is:

1. A semiconductor device having an asymmetric feature, the device comprising:
   a first gate formed on a substrate;
   first and second diffusion regions formed in the substrate on a side of the first gate;
   first and second contacts which contact the first and second diffusion regions, respectively, the first contact being asymmetric with respect to the second contact;
   a first FET comprising the first and second diffusion regions, first gate and first and second contacts;
   a second FET formed on the substrate adjacent to the first FET and including a second gate formed on the substrate third and fourth diffusion regions formed in the substrate on a side of the second gate, and third and fourth contacts which contact the third and fourth diffusion regions, respectively; and
   a third FET formed on the substrate adjacent to the second FET, the third FET including a third ate formed on the substrate fifth and sixth diffusion regions formed in the substrate on a side of the third gate, and fifth and sixth contacts which contact the fifth and sixth diffusion regions, respectively,
   wherein a pitch between the first and second gates comprises a first pitch and a pitch between the second and third gates comprises a second pitch which is different from the first pitch.

2. The semiconductor device of claim claim 1, wherein the asymmetry of the first and second contacts comprises one of:
   the first contact is located a first distance from the first gate, and the second contact is located a second distance from the first gate, the second distance being different than the first distance;
   the first contact comprises a first volume, and the second contact comprises a second volume, the second volume being different than the first volume;
   the first contact comprises a first material, and the second contact comprises a second material, the second material being different than the first material; and
   the first contact comprises one of a stressed and unstressed contact, and the second contact comprises the other one of the stressed and unstressed contact.

3. The semiconductor device of claim 1, wherein the first pitch is greater than the second pitch.

4. The semiconductor device of claim 1, wherein the first and third gates have a first gate length, and the second gate has a second gate length which is less than first gate length.

5. The semiconductor device of claim 1, wherein the second diffusion region includes a width which is greater than a width of the first diffusion region.

6. The semiconductor device of claim 5, wherein a distance between the second contact and the first gate is greater than a distance between the first contact and the first gate.

7. The semiconductor device of claim 1, wherein at least one of the first and second contacts comprise stressed contacts.

8. A logic device, comprising:
   the semiconductor device of claim 1.

9. A test structure for evaluating an impact of a stressed contact upon performance of a device, comprising:
   the semiconductor device of claim 1.

10. device including an asymmetric feature, comprising:
    a first FET comprising;
       a first gate formed on a substrate;
       first and second diffusion regions formed in the substrate on a side of the first gate; and
       first and second contacts which contact the first and second diffusion regions, respectively, the first contact being asymmetric with respect to the second contact;
    a second FET formed on the substrate adjacent to the first FET and including a second gate formed on the substrate, third and fourth diffusion regions formed in the substrate on a side of the second gate, and third and fourth contacts which contact the third and fourth diffusion regions, respectively; and
    a third FET formed on the substrate adjacent to the second FET, the third FET including a third gate formed on the substrate, fifth and sixth diffusion regions formed in the substrate on a side of the third gate, and fifth and sixth contacts which contact the fifth and sixth diffusion regions, respectively,
    wherein a pitch between the first and second gates comprises a first pitch and a pitch between the second and third gates comprises a second pitch which is different from the first pitch, and
    wherein the asymmetry of the first and second contacts comprises one of:
       the first contact is located a first distance from the first gate, and the second contact is located a second distance from the first gate, the second distance being different than the first distance;
       the first contact comprises a first volume, and the second contact comprises a second volume, the second volume being different than the first volume;
       the first contact comprises a first material, and the second contact comprises a second material, the second material being different than the first material; and
       the first contact comprises one of a stressed and unstressed contact, and the second contact comprises the other one of the stressed and unstressed contact.

* * * * *